(12) United States Patent
Brennan et al.

(10) Patent No.: US 7,143,709 B2
(45) Date of Patent: Dec. 5, 2006

(54) SURFACE TOPOGRAPHY FOR NON-TOXIC BIOADHESION CONTROL

(75) Inventors: Anthony B. Brennan, Gainesville, FL (US); Ronald H. Baney, Gainesville, FL (US); Michelle L. Carman, Gainesville, FL (US); Thomas G. Estes, Columbia, SC (US); Adam W. Feinberg, Gainesville, FL (US); Leslie H. Wilson, Gainesville, FL (US); James F. Schumacher, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 11/202,532

(22) Filed: Aug. 12, 2005

(65) Prior Publication Data

US 2006/0219143 A1   Oct. 5, 2006

Related U.S. Application Data

(63) Continuation-in-part of application No. 10/780,424, filed on Feb. 17, 2004.

(51) Int. Cl.
*B63B 59/00* (2006.01)
(52) U.S. Cl. .................................................. 114/222
(58) Field of Classification Search ................ 114/222, 114/67 R; 405/216; 422/6
See application file for complete search history.

(56) References Cited

U.S. PATENT DOCUMENTS

2005/0003146 A1*   1/2005   Spath ...................... 428/105

* cited by examiner

*Primary Examiner*—Sherman Basinger
(74) *Attorney, Agent, or Firm*—Akerman Senterfitt; Neil R. Jetter

(57) ABSTRACT

A coated surface for resisting or enhancing bioadhesion includes at least one patterned polymer including coating layer having a plurality of features attached to or projected into a base surface. The features each have at least one microscale (<1 mm) dimension and have at least one neighboring feature having a substantially different geometry. The patterned coating layer preferably provides an average roughness factor (R) of from 4 to 50. The coating layer resists or enhances bioadhesion as compared to the base surface.

18 Claims, 6 Drawing Sheets

| | Depth (um) | Spacing (um) | Width (um) | Roughness Factor |
|---|---|---|---|---|
| Riblet | 5 | 2 | 2 | 5.0 |
| | 8 | 2 | 2 | 7.3 |
| | 10 | 2 | 2 | 8.9 |
| Star / Clover | 5 | 2 | 4 | 4.5 |
| | 8 | 2 | 4 | 6.6 |
| | 10 | 2 | 4 | 8.0 |
| | 5 | 2 | 2,4 | 3.6 |
| | 8 | 2 | 2,4 | 5.2 |
| | 10 | 2 | 2,4 | 6.2 |
| Gradient | 5 | 1,2,3,4 | 2 | 2.8 |
| | 8 | 1,2,3,4 | 2 | 3.8 |
| | 10 | 1,2,3,4 | 2 | 4.5 |
| Triangle / Circle | 5 | 1 | 1,5 | 7.5 |
| | 5 | 2 | 2,10 | 4.2 |
| | 5 | 3 | 3,15 | 3.2 |
| | 8 | 1 | 1,5 | 11.3 |
| | 8 | 2 | 2,10 | 6.2 |
| | 8 | 3 | 3,15 | 4.4 |
| | 10 | 1 | 1,5 | 13.9 |
| | 10 | 2 | 2,10 | 7.5 |
| | 10 | 3 | 3,15 | 5.3 |

FIG. 3

SURFACE TOPOGRAPHY FOR NON-TOXIC BIOADHESION CONTROL

CROSS-REFERENCE TO RELATED APPLICATIONS

This application is a continuation-in-part (CIP) application claiming priority to U.S. patent application Ser. No. 10/780,424 entitled "DYNAMICALLY MODIFIABLE POLYMER COATINGS AND DEVICES" which was filed on Feb. 17, 2004, which is incorporated by reference in its entirety into the present application.

STATEMENT REGARDING FEDERALLY SPONSORED RESEARCH OR DEVELOPMENT

The United States Government has rights in this invention pursuant to Office of Naval Research (ONR) Grant No. N00014-02-1-0325.

FIELD OF THE INVENTION

The invention relates to articles having surface topography and/or surface elastic properties for providing non-toxic bioadhesion control.

BACKGROUND

Biofouling is the unwanted accumulation of organic and inorganic matter of biological origin on surfaces. For example, in the marine environment biofouling is the result of marine organisms settling, attaching, and growing on submerged marine surfaces. The biofouling process is initiated within minutes of a surface being submerged in a marine environment by the absorption of dissolved organic materials which result in the formation of a conditioning film. Once the conditioning film is deposited, bacteria (e.g. unicellular algae) colonize the surface within hours of submersion. The resulting biofilm produced from the colonization of the bacteria is referred to as microfouling or slime and can reach thicknesses on the order of 500 µm.

Biofouling is estimated to cost the U.S. Navy alone over $1 billion per year by increasing the hydrodynamic drag of naval vessels. This in turn decreases the range, speed, and maneuverability of naval vessels and increases the fuel consumption by up to 30–40%. Thus, biofouling weakens the national defense. Moreover, biofouling is also a major economical burden on commercial shipping, recreational craft, as well as civil structures, bridges, and power generating facilities.

Any substrate in regular contact with water is likely to become fouled. No surface has been found that is completely resistant to fouling. Due to the vast variety of marine organisms that form biofilms, the development of a single surface coating with fixed surface properties for the prevention biofilm formation for all relevant marine organisms is a difficult if not impossible task.

Anti-fouling and foul-release coatings are two main approaches currently used for combating biofilm formation. Anti-fouling coatings prevent or deter the settling of bio-fouling organisms on a surface by the use of leached biocides, typically cuprous oxide or tributyltin, into the water. The biocides are either tethered to the coated surface or are released from the surface into the surrounding environment. Use of these types of coatings has caused damage to the marine ecosystem, especially in shallow bays and harbors, where the biocides can accumulate. As such, the use of tributyltin has been banned in many parts of the world. These products are effective for only approximately 2 to 5 years.

Foul release coatings present a hydrophobic, low surface energy, and resulting slippery surface that minimizes the adhesion of the biofouling organisms. The most commonly used and highly successful of these is a nontoxic silicone-based paint. The silicone-based coating requires several layers to make it effective, and therefore it can be quite costly. Effectiveness lasts up to 5 years at which time recoating may become necessary. These products are considered to be more environmentally sound as compared to anti-fouling coatings because they do not leach toxins. However, they are subject to abrasion, and therefore their use is limited to areas that are not susceptible to damage caused by ice or debris.

Biofouling is similarly a problem for surfaces used in biomedical applications. The accumulations of bacteria, i.e. a biofilm, on implanted devices such as orthopedic prosthesis present a significant risk of infection leading to complications as severe as death. In cosmetic implants, devices such as breast implants are fouled with fibroblasts and acellular extracellular matrix resulting in a hard fibrous capsule and subsequent implant rupture. Blood contacting surfaces such as artificial heart valves and artificial vascular grafts are fouled by proteins such as fibrinogen that initiate the coagulation cascade leading in part to heart attack and stroke. The accumulated affect of biofouling on chronic and acute disease states, its contribution to morbidity and its massive medical expenses places biofouling as one of the major issues facing modern medicine.

SUMMARY OF THE INVENTION

A coated surface for resisting or enhancing bioadhesion include at least one patterned polymer comprising coating layer including a plurality of spaced apart features attached to attached to or projected into a base surface providing at least a first feature spacing distance (the distance between adjacent features). The features each have at least one microscale dimension. As used herein, "microscale" includes micron size or smaller, thus including microscale and nanoscale. At least one neighboring feature has a substantially different geometry. The patterned coating layer provides an average roughness factor (R) of from 2 to 50, preferably being at least 4. Depending on the features spacing, geometry and composition, the coating layer resists or enhancing bioadhesion as compared to the base surface.

A chemical composition of the coating layer can be the same or different as compared to the composition of the base surface. The coating layer can comprise a non-electrically conductive material, defined as having an electrical conductivity of less than $1 \times 10^{-6}$ S/cm at room temperature. The coating layer can comprise elastomers, rubbers, polyurethanes and polysulfones. The elastic modulus of the coating layer can be between 10 kPa and 10 MPa. In the case of 10 to 100 kPa materials, the coating can comprise hydrogels such as polyacrylic acid and thermo sensitive hydrogels such as poly isopropylacrylimide. The coating layer can be various thickness, such as 1 µm to 10 mm, preferably being between 100 µm to 1 mm.

An average spacing between adjacent features can be less than 5 µm in at least a portion of the coating, such as less than 2 µm. The plurality of features can provide a periodic pattern.

In one embodiment of the invention referred to as a hierarchical architecture, at least one multi-element plateau layer is disposed on a portion of the coating layer. A spacing distance between elements of the plateau layer provide a second feature spacing being substantially different as compared to the first feature spacing. The hierarchical architecture can simultaneously repel organisms having substantial different sizes, such as spores and barnacles.

An article having a surface coating with topography for controlling bioadhesion comprises a base surface, at least one patterned polymer comprising coating layer including a plurality of spaced apart features attached to or projected into the base surface which provide at least a first feature spacing distance. The features each have at least one microscale dimension and at least one neighboring feature having a substantially different geometry. The coating layer provides an average roughness factor (R) of from 2 to 50, preferably being from 4 to 50. The coating layer resists or enhances bioadhesion as compared to the base surface. The base surface can be a roofing material, the surface of a marine vessel, the inner surface of a water inlet pipe for a power plant, or an implantable device or material, such as a breast implant, a catheter or a heart valve.

BRIEF DESCRIPTION OF THE DRAWINGS

A fuller understanding of the present invention and the features and benefits thereof will be obtained upon review of the following detailed description together with the accompanying drawings, in which:

FIG. 3 provides a table of exemplary feature depths, feature spacings, feature widths and the resulting roughness factor (R) based on the patterns shown in FIGS. 2(a)–(d).

FIG. 5(b) is a scanned light micrograph image showing algae spores on the surface of the control sample, while FIG. 5(c) is a scanned light micrograph image showing a dramatic reduction in algae spores on the surface of the surface architecture according to the invention shown in FIG. 1(a).

DETAILED DESCRIPTION OF THE INVENTION

Figure 1A:
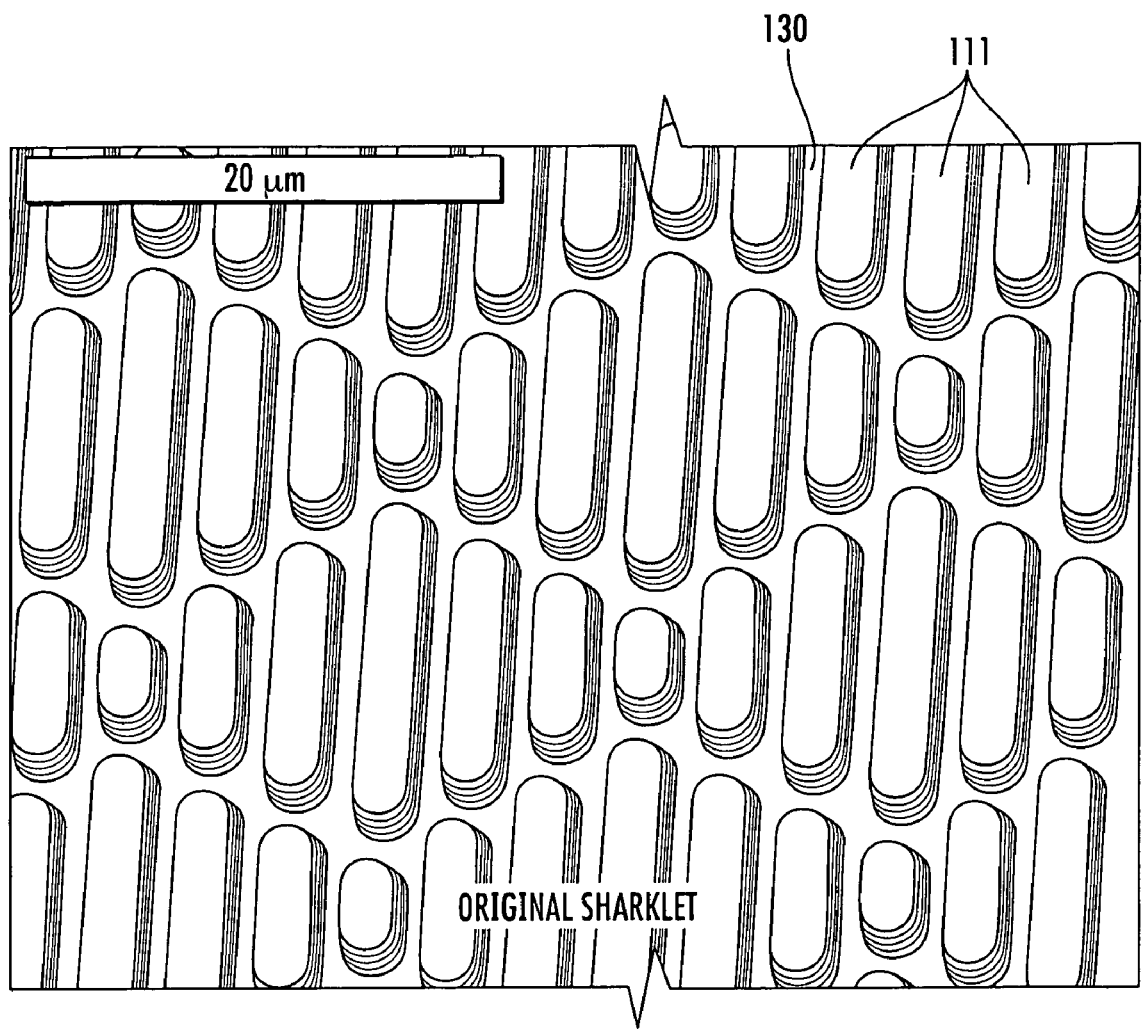
FIG. 1(a) is a scanned SEM image of an exemplary anti-algae surface architecture comprising a plurality of raised surfaces which project out from a base surface, according to an embodiment of the invention.

The invention describes a variety of scalable surface architectures for modification of biosettlement and bioadhesion, such as bioadhesion of biofouling organisms, including algae and barnacles. These architectures can generally be applied to a wide variety of surfaces for a wide variety of desired applications. Applications for inhibiting bioadhesion using the invention include base surfaces intended for use in marine environments or biomedical or other applications which may be exposed to contamination by biological organisms, such as roofs on buildings, water inlet pipes in power plants, catheters, cosmetic implants, and heart valves.

As described in the Examples below, it has been proven through experimental testing that architectures according to the invention provide a passive and non-toxic surface which can significantly and generally dramatically reduce settlement and adhesion of the most common fouling marine algae known. Other experiments have proven that other architectures according to the invention inhibit the settlement of barnacles. Various architectures can be combined into a hierarchical multi-level surface structure to provide a plurality of spacing dimensions to deter the settlement and adhesion of multiple organisms having multiple and wide ranging sizes simultaneously, such as algae, spores and barnacles.

Barnacles are known to be generally elliptically shaped have a nominal length of about 100 μm, and a width of about 30 μm. Algae are also generally elliptically shaped and have a nominal length of about 7 μm, and a width of about 2 μm, while spores are generally elliptically shaped have a nominal length of about 5 μm, and a width of about 1.5 μm. Features are generally raised surfaces (volumes) which emerge from a base level to provide a first feature spacing, or in the case of hierarchical multi-level surface structures according to the invention also include the a second feature spacing being the spacing distance between neighboring plateaus, which themselves preferably include raised features thereon. However, as noted above, features can also be projected into a base surface.

If the feature spacing is smaller than the smaller dimension of the organism or cell, it has been found that the growth is generally retarded, such between 0.25 and the smaller dimension of the cell or organism. A feature spacing of about ½ the smaller dimension of a given organism to be repelled has been found to be near optimum. For example, an algae spore is generally 2 to 5 μm in width. Accordingly, to retard adhesion of algae spores, a feature spacing of less than 2 μm is preferably used to retard algae spore growth. For example, to repel barnacles, a feature spacing of about 15 to 20 μm has been found to be effective. For repelling both barnacles and spores, a hierarchical multi-level surface structure according to the invention can include a raised surfaces (volumes) which emerge from or are projected into a base level having a feature spacing of about 2 μm, and a plurality of striped plateau regions spaced 20 μm apart, the plateau regions also including raised surfaces (volumes) which emerge from or are projected into the plateau having a spacing of about 2 μm. One or more additional plateau regions can be used to repel additional organisms having other sizes. The additional plateau regions can be aligned (parallel) with the first plateau, or oriented at various other angles.

Although generally described for deterring biodahesion, the invention can also be used to encourage bioadhesion, such as for bone growth. Feature dimensions of at least equal to about the size of the larger dimension of bioorganism or cells to be attached have been found to be effective. For example, to promote the adherence of barnacles, a feature spacing of 100 to 200 μm can be used.

Coated surfaces according to the invention generally comprise at least one patterned polymer comprising coating layer including a plurality of features attached to or projected into a base surface layer. Although the coating layer is generally described herein as being an entirely polymeric layer, the coating can include non-polymeric elements that contribute to the viscoelastic and topographical properties. A "feature" as used herein is defined as a volume (L, W and H) that projects out the base plane of the base material or an indented volume (L, W and H) which projects into the base material. The claimed architecture is not limited to any specific length. For example, two ridges of an infinite length parallel to one another would define a channel in between. In contrast, by reducing the overall lengths of the ridges one can form individual pillars. Although the coating is generally a different material as compared to the base material, the invention includes embodiments where the coating and base layer are formed from the same material, such as provided by a monolithic design, which can be obtainable by molding.

Each of the features have at least one microscale dimension. In some embodiments, the top surface of the features are generally substantially planar.

Although feature spacing has been found to be the most important design parameter, feature dimensions can also be significant. In a preferred embodiment of the invention, each of the features include at least one neighboring feature having a "substantially different geometry". "Substantially different geometry" refers to at least one dimension being at least 10%, more preferably 50% and most preferably at least 100% larger than the smaller comparative dimension. The feature length or width is generally used to provide the substantial difference. Regarding the prevention of bioadhesion, the width of the features in architectures according to the invention are preferably 0.50 to 0.75 of the overall diameter of the cell or organism attempting to settle, bond or attach, but can be larger or smaller than this range. To enhance bioadhesion, the width of the features in architectures according to the invention are preferably greater than or equal to the overall diameter of the cell or organism attempting to settle, bond or attach, but can be larger or smaller than this range.

The composition of the patterned coating layer may also provide surface elastic properties which also can provide some bioadhesion control. In a preferred embodiment when bioadhesion is desired to be minimized, the coated surface distributes stress to several surrounding features when stress is applied to one of the features by an organism to be repelled from the surface.

The roughness factor (R) is a measure of surface roughness. R is defined herein as the ratio of actual surface area (Ract) to the geometric surface area (Rgeo); R=Ract/Rgeo). An example is provided below for a 1 $cm^2$ piece of material. If the sample is completely flat, the actual surface area and geometric surface area would both be 1 $cm^2$. However if the flat surface was roughened by patterning, such as using photolithography and selective etching, the resulting actual surface area becomes much greater that the original geometric surface area due to the additional surface area provided by the sidewalls of the features generated. For example, if by roughening the exposed surface area becomes twice the surface area of the original flat surface, the R value would thus be 2.

The architectural pattern generally provides a roughness factor (R) of at least 2. It is believed that the effectiveness of a patterned coating according to the invention will improve with increasing pattern roughness above an R value of about 2, and then likely level off upon reaching some higher value of R. In a preferred embodiment, the roughness factor (R) is at least 4, such as 5, 6, 7, 8, 9, 10 11, 12, 13, 14, 15, 16, 17, 18, 19, 20, 25 or 30. Assuming deeper and more closely spaced features can be provided, R values can be higher than 30.

FIG. 1(a) is a scanned SEM image of an exemplary anti-algae surface architecture according to an embodiment of the invention. Coating layer comprises a plurality of features 111 which are attached to and project out from base surface 130. Base surface 130 can be a roofing material, the inner surface of a water inlet pipe for a power plants, an implantable device or material, such as a breast implant, a catheter or a heart valve. Each of the features 111 have at least one microscale dimension, with a width of about 3 μm, lengths of from about 3 to about 16 μm, and a feature spacing of about 1.5 μm. The thickness (height) of features 111 comprising coating layer is about three (3) microns.

Features adjacent to a given feature 111 generally provide substantially different dimensions, in the arrangement shown in FIG. 1(a), feature lengths. The top surface of the features is shown as being planar. The patterned coating layer generally resists of algae as compared to a generally planar base surface as described in the Examples and shown in FIGS. 5(a)–(c).

Figure 1B:
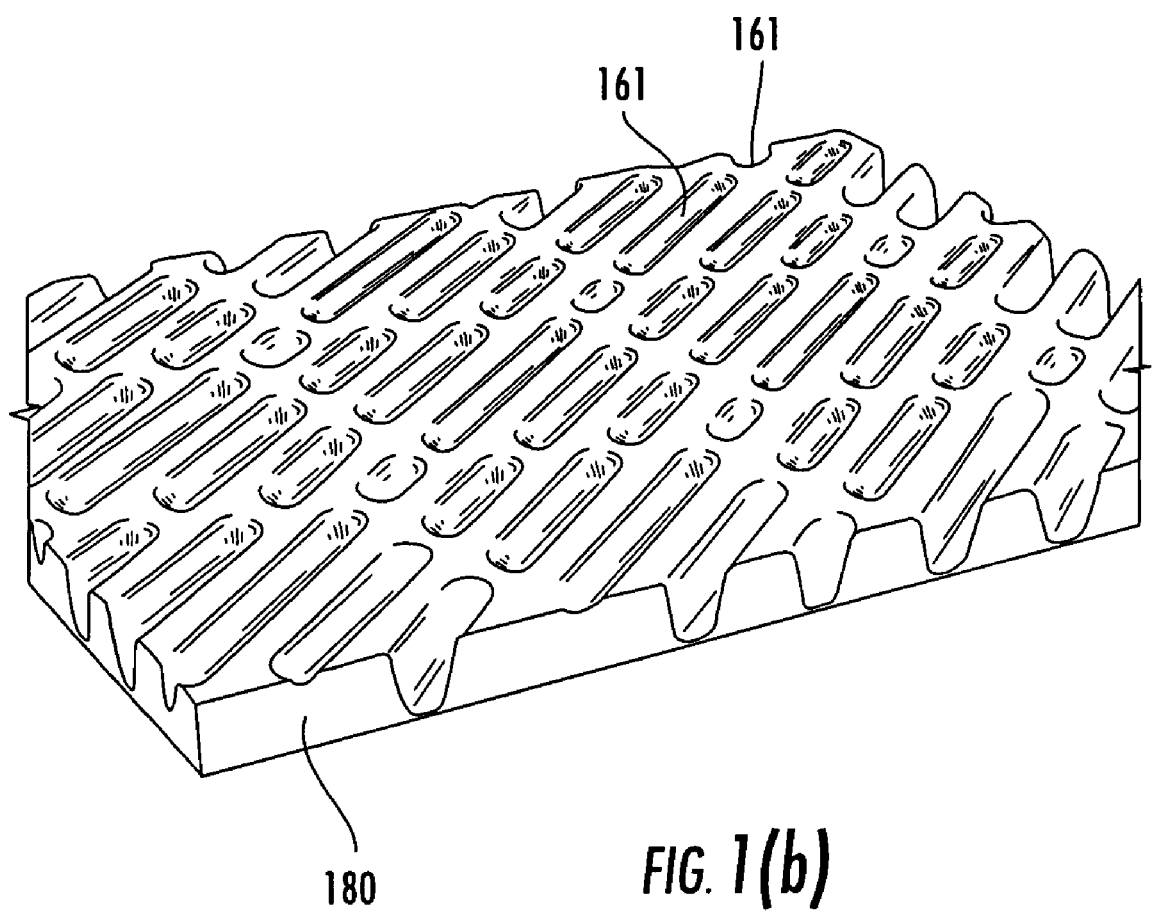
FIG. 1(b) is a scanned optical profilometry image of a pattern having a plurality of features projecting into a base surface, according to another embodiment of the invention.

FIG. 1(b) is a scanned optical profilometry image of a pattern having a plurality of features 161 projecting into a base surface 180, according to another embodiment of the invention. Features 161 comprise indented void volumes into base surface 180. Although not shown, a surface can include regions having raised features 111 shown in FIG. 1(a) together with regions having indented features 161 shown in FIG. 1(b).

The composition of the patterned coating layer shown in FIG. 1(a) and 1(b) is a polymethylsiloxane (PDMS) elastomer SILASIC T2™ provided by Dow Corning Corp. In certain inventive embodiments, the base material is a plastic or a metal. A typical coating material is a polymer, such as an elastomer of a relative low elastic modulus. The features 111 need not be formed from a single polymer. Features can be formed from copolymers, polymer composites, steel, aluminum, or ceramic. The coating layer is also typically hydrophobic, but can also be neutral or hydrophilic.

As noted above, the patterned coating layer may also provide surface elastic properties which can influence the degree of bioadhesion directly, an in some cases, also modulate surface chemistry of the coating layer. It is believed that a low elastic modulus of the patterned coating layer tends to retard bioadhesion, while a high elastic modulus tends to promote bioadhesion. A low elastic modulus is generally from about 10 kPa and 10 MPa, while a high elastic modulus is generally at least 1 GPa.

The patterned coating layer can be applied using a number of techniques, which generally depend on the area to be covered. For small area polymer layer applications, such as on the order of square millimeters, or less, techniques such as conventional photolithography, wet and dry etching, and ink-jet printing can be used to form a desired polymer pattern if a pattern is desired. When larger area layers are required, such as on the order of square centimeters, or more, spray, dipcoat, hand paint or a variant of the well known "applique" method be used. These larger area techniques would effectively join a plurality of smaller regions configured as described above to provide a polymer pattern over a large area region, such as the region near and beneath the waterline of a ship.

Figure 2A:
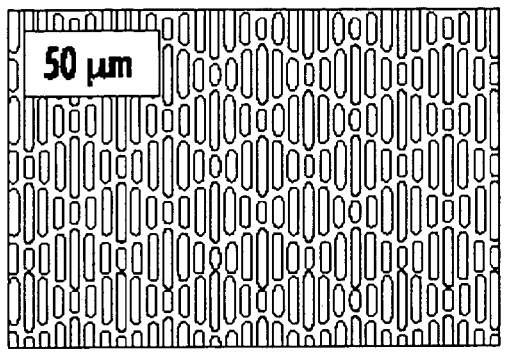
FIG. 2(a)–(d) illustrate some exemplary surface architectural patterns according to the invention.
Figure 2B:
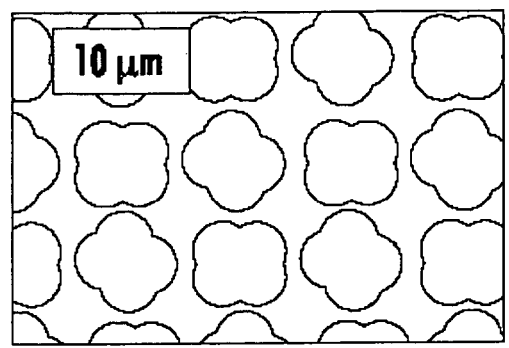
Figure 2C:
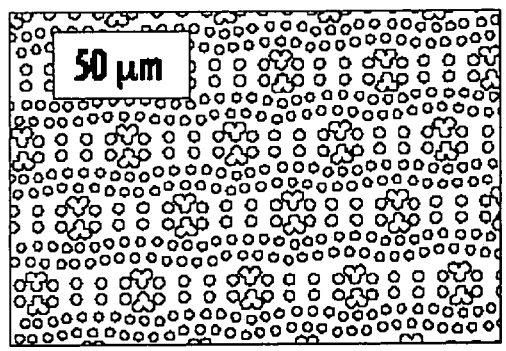
Figure 2D:
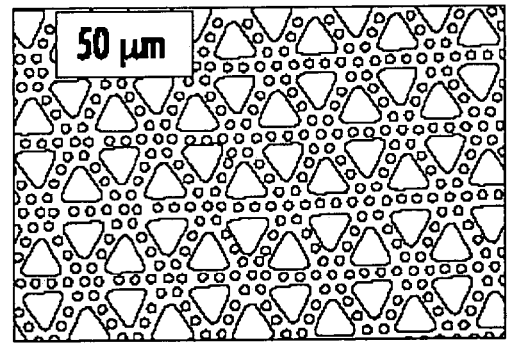

FIGS. 2(a)–(d) illustrate some exemplary architectural patterns (unit cells) that can be used with the invention. FIG. 2(a) shows a riblet pattern fabricated from PDMS elastomer having features spaced about 2 μm apart on a silicon wafer. The features were formed using conventional photolithographic processing. FIG. 2(b) shows a star/clover pattern, FIG. 2(c) a gradient pattern, while FIG. 2(d) shows a triangle/circle pattern.

FIG. 3 provides a table of exemplary feature depths, feature spacings, feature widths and the resulting roughness factor (R) based on the patterns shown in FIGS. 2(a)–(d). Regarding the riblet pattern shown in FIG. 2(a) for the depth, spacing and widths shown, the resulting pattern roughness factor (R) ranged from 5.0 to 8.9. Similar data for the star/clover pattern (FIG. 2(b)), gradient pattern (FIG. 2(c)), and triangle/circle (FIG. 2(d)) are also shown in FIG. 3. Regarding the triangle/circle arrangement (FIG. 2(d)), for a feature depth of 10 µm, feature spacing of 1 µm, and feature width of 1 µm (circles) and 5 µm (triangles), a roughness factor (R) of 13.9 is obtained.

Figure 4:
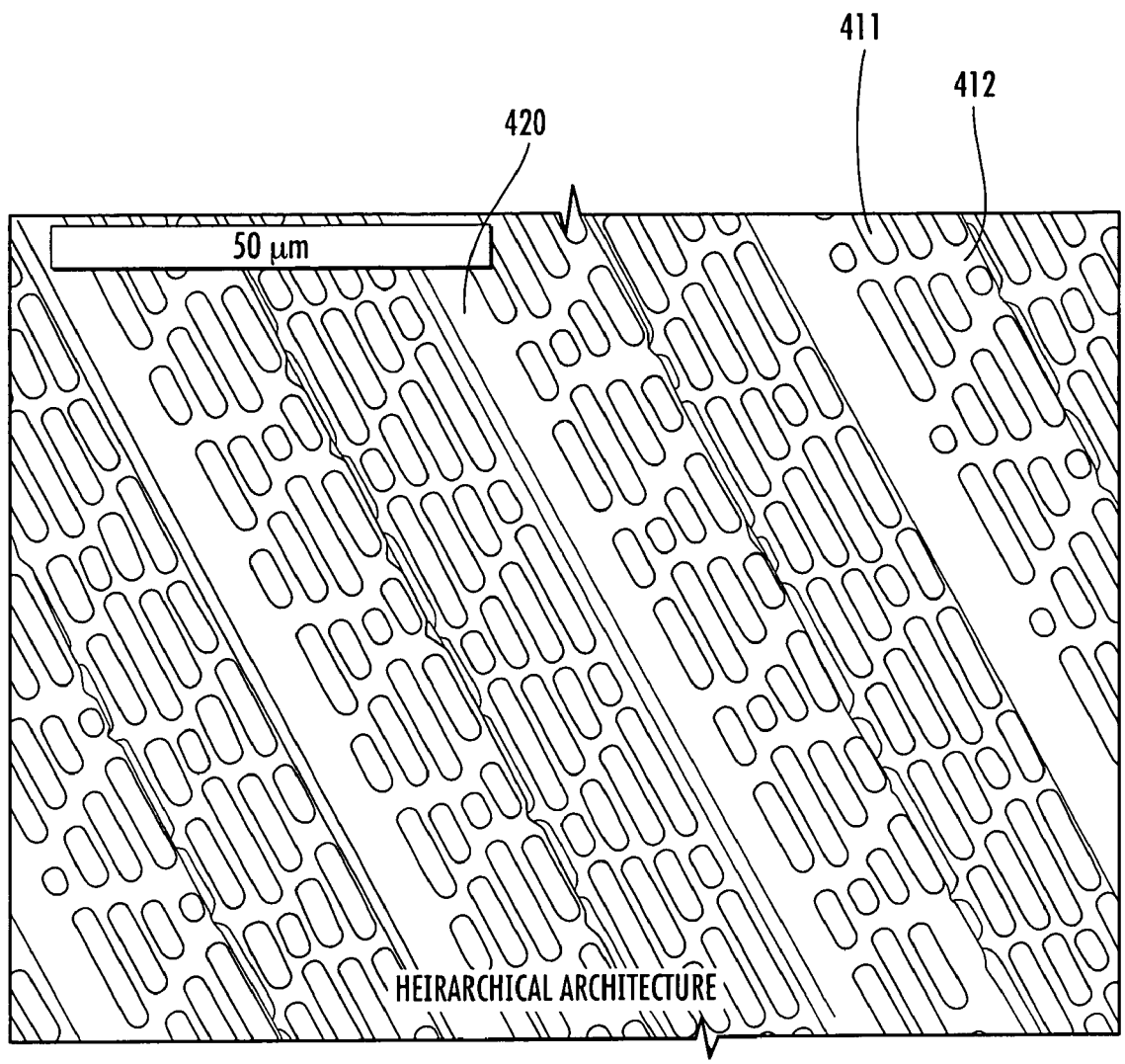
FIG. 4 is a scanned SEM image of an exemplary hierarchical surface architecture according to an embodiment of the invention.

FIG. 4 is a scanned SEM image of an exemplary hierarchical (multi-layer) surface architecture according to an embodiment of the invention. The first feature spacing distance of about 2 µm between features 412 and its neighboring features including feature 411 is for deterring a first organism, or organism in a size range of about 5 µm, or less. For example, as noted above, an algae spore is nominally 5 µm wide. A patterned second layer comprising a plurality of striped plateau regions 420 is disposed on the first layer. A spacing distance between elements of the plateau layer provide a second feature spacing which is substantially different as compared to the first feature spacing. As used herein, a "substantially different spacing distance" is at least 50% larger, and is preferably at least 100% larger than the smaller first feature spacing distance. In FIG. 4, the architecture shown provides a spacing distance between the second pattern strips of about 20 µm, or about 900% greater than the first spacing distance. The 20 µm spacing is approximate ½ the width of a nominal barnacle thus repelling barnacles. Thus, hierarchical (multi-layer) surface architectures according to the invention can simultaneously repel multiple organisms covering a significant range of sizes.

The invention provides numerous benefits to a variety of applications since surface properties can be customized for specific applications. The invention can provide reduced energy and cost required to clean surfaces of biofouling by reducing biofouling in the first place. As a result, there can be longer times between maintenance/cleaning of surfaces. As explained below, the invention can also provide non-capsule formation due to foreign body response in the case of coated implanted articles. The invention can also be configured provide enhanced adhesion to surfaces.

The invention is thus expected to have application for a variety of products including exterior surfaces of marine vessels including ships and associated bilge tanks and gray water tanks and water inlet/outlet pipes can benefit from the bioadhesion resistance provided by coating architectures according to the invention. Water treatment plants, power plants, pumping stations, swimming pools can also benefit from bioadhesion resistance provided by coatings according to the invention.

The invention is also expected to have application for cosmetic implants, such as breast plant shells or other fluid filled implant shells. Breast implant complications are believed to be largely associated with fibrous encapsulation and embrittlement of shell. The invention enables an increase in bioacceptance of shell and elimination or at least substantial reduction of encapsulation. Aquariums and fountains, aircraft surfaces, roofs, air ducts, building exteriors and heart valves are other non-limiting examples of other applications for the invention.

EXAMPLES

It should be understood that the Examples described below are provided for illustrative purposes only and do not in any way define the scope of the invention.

Figure 5A:
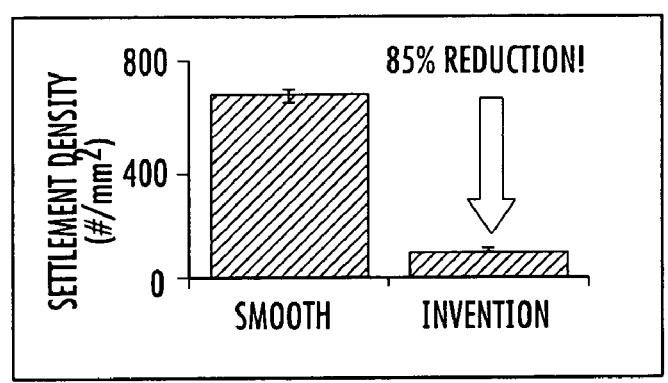
FIG. 5(a) shows settlement density data for algae spores on a smooth control sample as compared to the settlement density on the surface architecture according to the invention shown in FIG. 1(a)
Figures 5B, 5C:
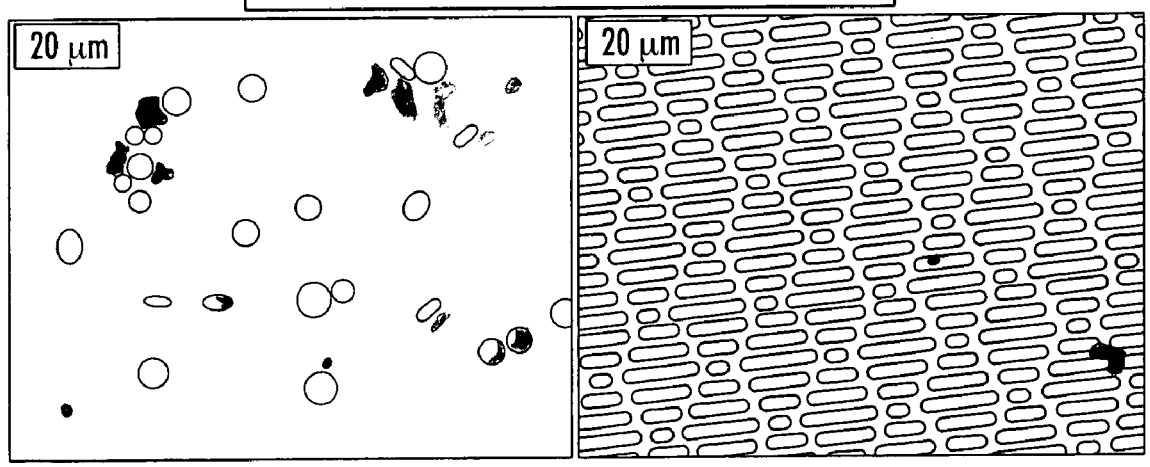

An experiment was performed to compare the performance of an exemplary surface architecture according to the invention as compared to a planar uncoated control surface (PDMS elastomer) against bioadhesion of algae spores. The features were formed from PDMS elastomer. The surface architecture is shown in FIG. 1(a). Following 45 minutes of exposure, as shown in FIG. 5(a), the settlement density of algae spores on the smooth control sample was about 720/mm$^2$, while the settlement density for the surface architecture according to the invention was only about 100/mm$^2$, or only about 15% of the settlement density of the control. FIG. 5(b) is a scanned light micrograph image of the surface of the control, while FIG. 5(c) is a scanned light micrograph image of the surface of the surface architecture according to the invention.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

We claim:

1. A coated surface topography for resisting bioadhesion, comprising:
    at least one coating layer that comprises a polymer, said coating layer having a pattern defined by a plurality of spaced apart features attached to or projected into a base surface, said plurality of features each having at least one microscale dimension and having at least one neighboring feature having a substantially different geometry, wherein an average spacing between adjacent ones of said features is between 0.5 and 5 µm in at least a portion of said coating layer, said coating layer resisting bioadhesion as compared to said base surface.

2. The coated surface of claim 1, wherein a chemical composition of said coating layer is different as compared to a composition of said base surface.

3. The coated surface of claim 1, wherein said coating layer comprises a non-electrically conductive material.

4. The coating of claim 1, wherein said coating layer provides an average roughness factor (R) of from 4 to 50.

5. The coating of claim 1, wherein an elastic modulus of said coating layer is between 10 kPa and 10 MPa.

6. The coating of claim 1, wherein said plurality of spaced apart features have a substantially planar top surface.

7. The coating of claim 1, wherein said spacing is between 0.5 and 2 µm.

8. The coating of claim 1, further comprising at least one multi-element plateau layer disposed on a portion of said coating layer, wherein a spacing distance between elements of said plateau layer provide a second feature spacing being substantially different as compared to said first feature spacing.

9. The coating of claim 1, wherein said polymer comprises at least one selected from the group consisting of elastomers, rubbers, polyurethanes and polysulfones.

10. An article having a surface coating with topography for controlling bioadhesion, comprising:
    a base surface; and
    at least one coating layer that comprises a polymer, said coating layer having a pattern defined by a plurality of spaced apart features attached to or projected into a base surface, said plurality of features each having at least one microscale dimension and having at least one neighboring feature having a substantially different geometry, wherein an average spacing between adjacent ones of said features is between 0.5 and 5 µm in at least a portion of said coating layer, said coating layer resisting bioadhesion as compared to said base surface.

11. The article of claim 10, wherein said base surface comprises a roofing material.

12. The article of claim 10, wherein said base surface comprises an inner surface of a water inlet pipe for a power plants.

13. The article of claim 10, wherein said base surface comprises an implantable device or material.

14. The article of claim 13, wherein said implantable device or material comprises a breast implant, a catheter or a heart valve.

15. The article of claim 10, further comprising at least one multi-element plateau layer disposed on a portion of said coating layer, wherein a spacing distance between elements of said plateau layer provide a second feature spacing being substantially different as compared to said first feature spacing.

16. The article of claim 10, wherein an elastic modulus of said coating layer is between 10 kPa and 10 MPa.

17. The article of claim 10, wherein said plurality of spaced apart features have a substantially planar top surface.

18. The article of claim 10, wherein said coating layer provides an average roughness factor (R) of from 4 to 50.

* * * * *